(12) United States Patent
Hutchin (10) Patent No.: US 8,941,042 B2
(45) Date of Patent: Jan. 27, 2015

(54) MULTI-BEAM LASER BEAM CONTROL AND IMAGING SYSTEM AND METHOD

(76) Inventor: Richard A. Hutchin, Calabasas, CA (US)

( * ) Notice: Subject to any disclaimer, the term of this patent is extended or adjusted under 35 U.S.C. 154(b) by 368 days.

(21) Appl. No.: 13/476,380

(22) Filed: May 21, 2012

(65) Prior Publication Data

US 2012/0292481 A1  Nov. 22, 2012

Related U.S. Application Data

(60) Provisional application No. 61/488,213, filed on May 20, 2011.

(51) Int. Cl.
*H01S 3/10* (2006.01)
*G01D 3/00* (2006.01)
*H01L 27/146* (2006.01)
*F41H 13/00* (2006.01)
*G01S 17/89* (2006.01)
*G01S 7/481* (2006.01)
*G01S 7/497* (2006.01)

(52) U.S. Cl.
CPC ...... *H01L 27/14629* (2013.01); *F41H 13/0062* (2013.01); *G01S 17/89* (2013.01); *G01S 7/4815* (2013.01); *G01S 7/497* (2013.01)
USPC ............... 250/201.9; 250/203.1; 356/521; 372/29.023

(58) Field of Classification Search
CPC ... H01S 3/10; H01S 3/10053; H01S 3/10076; G05D 1/0231; G05D 1/0236; G05D 1/12; G05D 3/00
USPC ......... 250/201.9, 203.1, 203.2; 356/451, 488, 356/494, 499, 521; 372/9, 29.01, 29.016, 372/29.023
See application file for complete search history.

(56) References Cited

U.S. PATENT DOCUMENTS 5,969,334 A * 10/1999 Hutchin ..................... 250/201.9
8,415,600 B2 * 4/2013 Hutchin ..................... 250/201.9

* cited by examiner

*Primary Examiner* — Kevin Pyo

(57) ABSTRACT

A multi-beam laser beam control and imaging system includes a laser transmitter configured to emit light in a plurality of beamlets towards a target. At least one of the beamlets illuminates the whole target or a substantial portion of the target when imaging the target. A sensor is configured to receive light from the beamlets. A processor is communicably coupled to the sensor and configured to compute a relative phase of a wavefront of at least one beamlet based on output from the sensor. The processor also reconstructs a wavefront which is used to formulate two or three dimensional images of the target. A controller is communicably coupled to the processor and to the laser transmitter. The controller is configured to adjust a phase of at least one of the beamlets.

36 Claims, 9 Drawing Sheets

MULTI-BEAM LASER BEAM CONTROL AND IMAGING SYSTEM AND METHOD

PRIORITY

Priority is claimed to U.S. provisional application No. 61/488,213, filed May 20, 2012, the disclosure of which is incorporated herein by reference in its entirety.

BACKGROUND OF THE INVENTION

1. Field of the Invention

The field of the present invention relates to multi-beam laser beam control and imaging systems which are capable of compensating for wavefront distortions in a laser beam traveling from its source to a remote target through an atmospheric path, creating a two or three dimensional image of the target, and selecting and maintaining a suitable hitspot location on the target.

2. Background

Lasers are often operated in applications that require tracking and phase correction to form high quality focused spots at targets located substantial distances from the laser source. Due to boundary layer disturbances and other atmospheric turbulence, a laser beam control system is typically employed to maintain high beam quality at the target. The beam control system provides the ability to both sense the phase distortions and to correct them at the laser source. Because the boundary layer and atmospheric distortions are often dynamic, the beam control system is usually operated in closed loop at sufficient bandwidth to keep up with the dynamics of the atmosphere.

One utility for such a system is a set of military applications where it is desirable to focus the energy of a high energy laser (HEL) to achieve maximum intensity at a specified location of a remote target. This laser energy may be generated as a single beam or as a set of multiple coherent beamlets which are tracked and phased to produce a high quality hit spot on the target.

In the case of a single beam laser source, the atmospheric turbulence effect on the HEL beam may be determined by transmitting a second lower power laser beam (or beacon) to the target and then measuring the wavefront phase of the beacon beam return that scatters from the target back into the HEL transmitting aperture. The inverse of the measured wavefront phase pattern is applied to the outgoing HEL beam which then provides the necessary phase correction. This process is well known in the art. An alternate high energy laser beam control architecture suitable for a laser-target engagement scenario is disclosed in U.S. patent application Ser. No. 12/412,547, filed Mar. 27, 2009, the disclosure of which is incorporated herein by reference in its entirety.

In the case of an HEL beam composed of multiple coherent beamlets, one option is to phase the beamlets together at the source and then transmit them as a single coherent beam to the target. However, this approach may require the use of a large beam director on a turret which is heavy and bulky. In addition, for HEL systems on air vehicles, the turret beam director can be disruptive to the aerodynamic performance of the vehicle. For these reasons, it is desirable to implement a multi-beamlet HEL system with many separate small beamlet apertures to make a much lighter, smaller and less intrusive HEL system. Such a multi-beam laser beam control architecture is disclosed in U.S. patent application Ser. No. 12/689,021, filed Jan. 18, 2010, the disclosure of which is incorporated herein by reference in its entirety.

Another utility for a multi-beam laser is two or three dimensional active imaging of a remote target or objects in an area of interest. A system and method for active imaging that is immune to atmospheric turbulence and capable of producing two or three dimensional images of objects is disclosed in U.S. patent application Ser. No. 13/046,109 filed Mar. 11, 2011, the disclosure of which is incorporated herein by reference in its entirety.

However, there is no known multi-beam laser system or technique in the art that offers the combined utility of two or three dimensional imaging of a remote target and focusing the energy of the laser to achieve maximum intensity at a specified location of the target.

SUMMARY OF THE INVENTION

The present invention is directed toward a system and method for controlling a multi-beam laser capable of both imaging a target and forming a high intensity hitspot on a target should it become desirable to tamper with, disable, or destroy that target. The images of the target may be two dimensional or three dimensional. Two dimensional images are projections of the target onto a two dimensional image plane whereas three dimensional images include range (or depth) information.

In the system, a laser transmitter is configured to emit light in a plurality of beamlets towards a target, and a sensor is configured to receive light reflected or scattered from the target when the beamlets emitted toward the target are incident on the target. A processor communicates with the sensor and is configured to compute a relative phase of a wavefront of at least one beamlet based on output from the sensor. A controller communicates with the processor and the laser transmitter and is configured to adjust a phase of at least one of the beamlets. The phase adjustment of beamlets may be aimed at forming a high intensity hitspot on the target. The sensor data may further be used for constructing an image of the hitspot on the target as well as the target itself.

The processor may be further equipped to control a separate illuminator to direct one or more beamlets towards the target. The light return from the target which is a result of the illuminator beamlet or beamlets is also received at the sensor and processed by the processor to produce two or three dimensional images of the target.

Many optional features, which may be implemented alone or in combination, are available within this system to introduce different functionality. With respect to the transmitter, it may advantageously include a master oscillator power amplifier or a fiber laser tree. It may also include a steering mechanism configured to steer at least one of the emitted beamlets. The laser transmitter may be configured to emit the beamlets at one or more wavelengths, at one or more polarizations, or at any combination of one or more wavelengths and one or more polarizations. The laser transmitter may also advantageously be configured to increment the phase of at least one of the beamlets by at least two offsets from an initial value and then to restore the phase to the initial value.

With respect to the sensor, it may include a plurality of sensor elements, each associated with its own receiving aperture. As a further option, one or more of the receiving apertures may include a steering mechanism configured to steer light incident upon the receiving aperture. The sensor may also be configured to measure intensity and/or phase differences at one or more wavelengths and/or one or more polarizations. As another advantageous option, light from the beamlets may be received by the sensor after being scattered off a target.

The processor may be configured to compute the phase value of at least one of the emitted beamlets to selectively enhance or suppress one or more features of the beamlets. The processor may also be configured to compute a three dimensional turbulence profile of space between the transmitter and the sensor.

With respect to the illuminator, the master oscillator power amplifier or a fiber laser tree may supply the laser source. Alternately, a separate laser source emitting one or more beamlets of a first wavelength followed one or more beamlets of a second wavelength may be used.

In the method aimed at multi-beam laser beam control for forming a high intensity hitspot, light is emitted in a plurality of beamlets from a laser transmitter, and light from the beamlets is detected at a sensor, with the phase and direction of at least one of the emitted beamlets being adjusted based upon the detected light. Several optional features may also be incorporated into the method, either alone or in combination. As one option, the phase of beamlets may be adjusted. This may include initially adjusting the phase of at least one of the beamlets prior to detecting light from the beamlets. It may also include adjusting the phase of a plurality of the beamlets, one beamlet at a time. When adjusting the phase of a beamlet, the phase may be incremented one or more times before being returned to an initial phase value. The method may further include calculating phase distortions induced by the transmission medium between the transmitter and the sensor when the phase of one or more beamlet is adjusted. These phase distortions may be used to compute a phase value for one or more of the beamlets. The phase distortions may also be used to aid in steering the point of incidence of the beamlets on the target by calculating an appropriate phase correction solution from the phase distortions.

In the method aimed at multi-beam laser imaging of the target, a technique known in the art as Sheared Coherent Interferometric Photography (SCIP) may be applied. SCIP allows near-diffraction limited remote imaging of objects through turbulent media. SCIP utilizes three illuminating beamlets and makes use of the physical properties, of speckle patterns. A speckle pattern is a random intensity pattern produced by the mutual interference of a set of wavefronts. Speckle patterns are created when a laser beam is scattered off a rough surface. Speckle patterns reflect off an object just like light off a mirror. Thus, if one moves the source 1 mm to the left, the speckle pattern scattered back from the target will move 1 mm to the right. Illuminating the object with three coherent beamlets at the same time results in three nearly identical interfering speckle patterns which can be observed or registered by a suitable sensor. Then by phase modulating the three beamlets with respect to each other, one can measure the phase differences between each of these speckle patterns. If one beamlet is considered the reference source, and another beamlet is shifted 1 mm in the x direction and the remaining beamlet is shifted 1 mm in the y direction, then the demodulated signals at the sensor will provide the discrete complex gradient of the speckle pattern at 1 mm spacing. These gradients can then be reconstructed in a noise-optimized manner to provide an excellent measurement of the full object speckle pattern at the detector plane. A simple Fourier transform will then produce the complex target image.

Accordingly, an improved system and method for controlling a multi-beam laser is disclosed. Advantages of the improvements will appear from the drawings and the description of the embodiments.

BRIEF DESCRIPTION OF THE DRAWINGS

In the following drawings, like reference numerals refer to similar components.

DETAILED DESCRIPTION OF THE PREFERRED EMBODIMENTS

Figure 1:
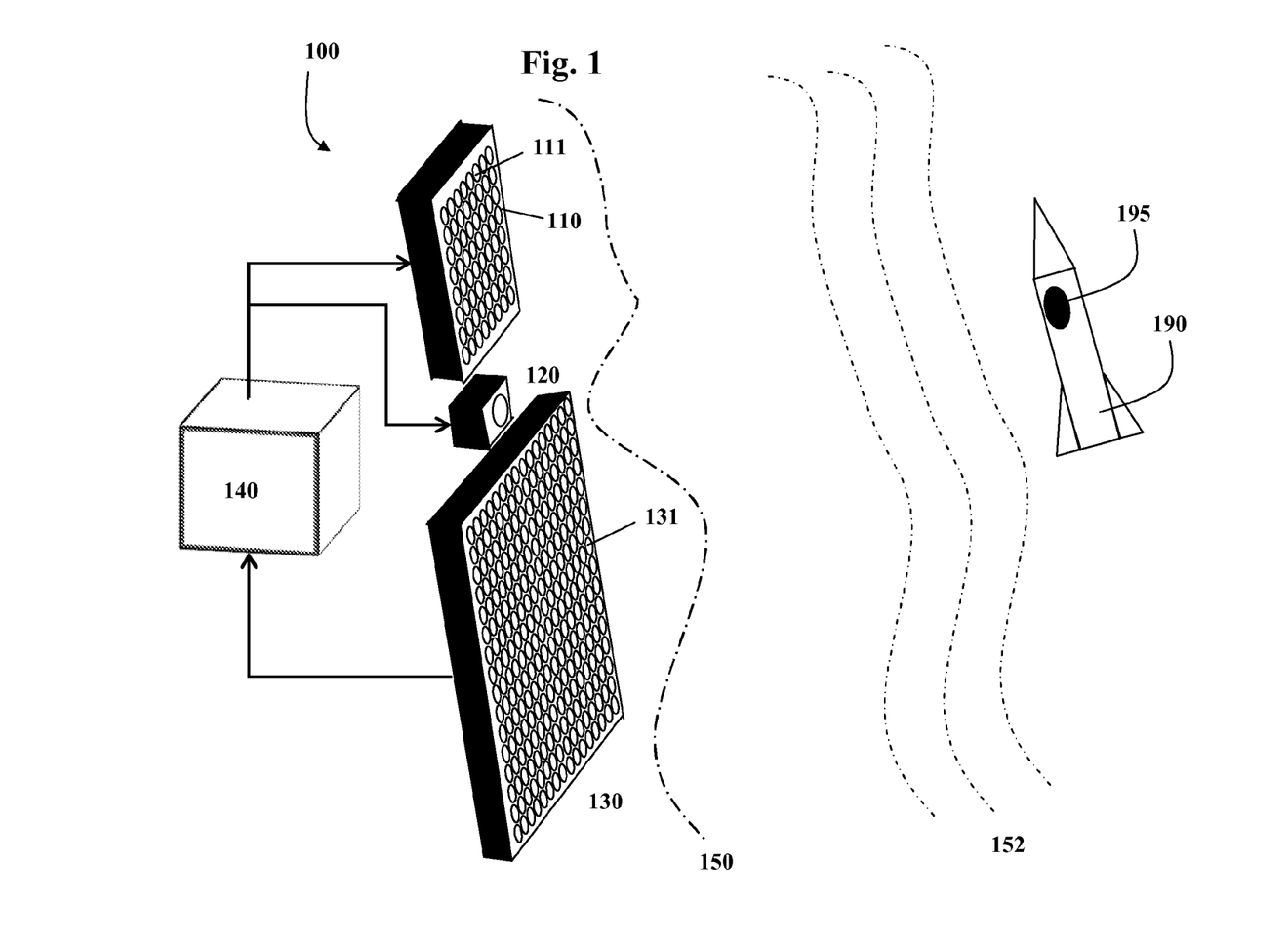
FIG. 1 schematically illustrates a multi-beam laser control and imaging system.

Turning in detail to the drawings, FIG. 1 illustrates a multi-beam laser beam control and imaging system 100 which includes a multi-beam transmitter array 110, an illuminator 120, and a multi-aperture sensor array 130, all communicably coupled to a processor 140. The multi-beam transmitter array 110 includes a plurality of transmit apertures 111, through which a plurality of beamlets are emitted. The transmitter array 110 may emit beamlets at one, two, or more predetermined wavelengths. Furthermore, the beamlets may be of various polarization states. The beamlets emitted through the plurality of transmit apertures 111 may also be switched between different wavelengths and polarization states during operation. As shown, the beamlets emitted from the transmitter array 110 are directed toward and incident upon a target 190. The beamlets may be collectively focused on a hitspot 195 on the target.

The illuminator 120 may emit one or more beams toward the same target 190. The system 100 may include multiple illuminators, for example four may be situated at each corner of transmitter array 110.

The illuminator 120 may be omitted altogether and one or more of the transmit apertures 111 may instead be used as an illumination source for imaging and tracking the target as well as the hitspot on the target.

The light emitted from the transmitter array 110 and the light emitted from the illuminator 120 travel through a boundary layer 150 and through atmospheric turbulence 152 to the remote target 190. The light scattered from the target 190 (i.e., return light) is received by the receive apertures 131 of the multi-aperture sensor array 130.

At least one of the transmit apertures 111 includes optical elements configured to adjust the phase or the direction of the beamlet emitted from that aperture. At least one of the receive apertures 131 includes optical elements configured to measure certain characteristics of the incident return light. These characteristics may include overall light intensity, intensity of light in a particular spectral band, intensity of light of a particular polarization state, and phase differences between light of different polarizations or polarization states. In addition, at least one of the receive apertures 131 is configured to steer the incoming return light toward a detector within the aperture. Using the output of the sensor array 130, the processor 140 is configured to calculate the phase values of beamlets emitted from the transmitter array 110. Details of the transmit apertures 111, receive apertures 121, and the operation of the processor 140 are discussed in greater detail below.

Several optical modifications may be incorporated into the system 100 without changing the basic principles of operation. For example, the transmit apertures 111 may be merged into a single aperture. As another example, any one or more of the transmit apertures 111, the illuminator 120, and the receive apertures 131 may be arranged on a non-planar or curved surface, instead of on a planar surface as shown. The apertures may also cover areas which are round, square, elliptical or almost any convenient geometrical configuration. They may even be dispersed over multiple disjoint regions. This adaptability allows for convenient flexibility in mounting the transmitter and sensor arrays. In addition, much of the performance is maintained even if some of the transmitter beamlets or sensor apertures malfunction. Such robust operation can be very desirable depending upon the application.

To minimize the amount of aerosol scatter received by the sensor array 130, the sensor array 130 and the transmitter array 110 can be positioned at some distance from one another. Aerosol scatter tends to be incoherent with respect to the target scatter, so the separation would largely improve the modulation level of the observed signal during operation, which in turn improves accuracy, providing better phasing control information for the transmitter beamlets. Such separation is thus not required but can be a performance enhancing feature.

The processor 140, which may be any type of general purpose programmable processor, receives and processes the sensor array 130 outputs to calculate phase modulation values for certain beamlets of the transmitter array 110. The processor 140 may then adjust the phase modulation values of one or more of the beamlets emitted by the transmitter array 110. These phase modulation value adjustments may be determined to compensate for the boundary layer 150 and the atmospheric turbulence 152 between the multi-beam transmitter array 110 and the target 190, as both the boundary layer 150 and the atmospheric turbulence 152 distort the phase of each beamlet exiting the transmitter array 110. The phase modulation value adjustments may also be determined such that a tightly focused beam can be directed to a particular hit spot 195 on the target 190.

Figure 2A:
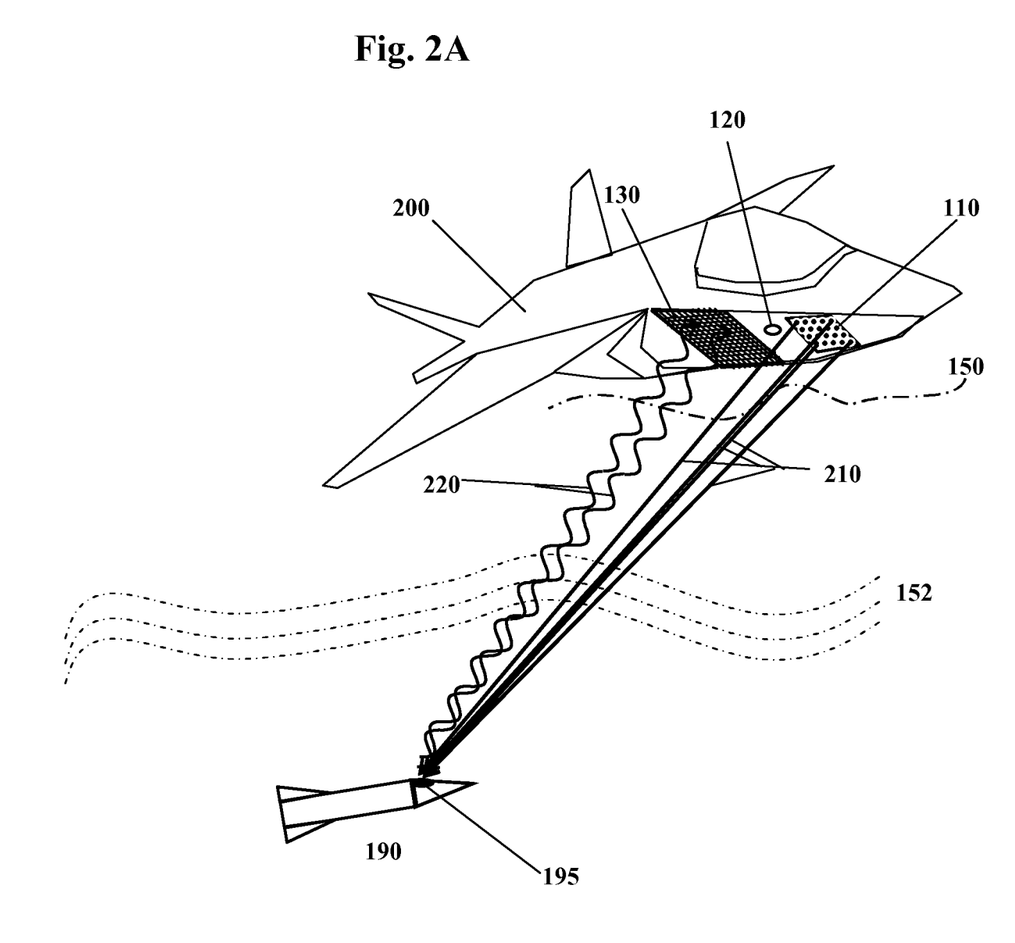
FIG. 2A schematically illustrates the multi-beam laser control and imaging system of FIG. 1 mounted on an airborne platform and used in a target engagement scenario.

FIG. 2A illustrates an engagement scenario that utilizes the multi-beam laser beam control and imaging system 100 mounted onto an aircraft 200. The transmitter array 110 emits multiple beamlets 210 steered and phased so that they are tightly focused at the hitspot 195 on the target 190. The return light 220 is received at the sensor array 130. The processor 140 (which is not shown in the figure) mounted inside the aircraft 200 receives multiple readings from the sensor array 130 which are used to calculate phase modulation values for certain beamlets of the transmitter array 110. The processor 140 may then adjust the phase modulation values of one or more of the beamlets emitted by the transmitter array 110. These phase modulation value adjustments may be determined to compensate for the boundary layer 150 and the atmospheric turbulence 152 between the multi-beam transmitter array 110 and the target 190 so that a tightly focused beam can be directed to a particular hit spot 195 on the target 190.

The transmitter array 110 may be constructed using an 8×8 arrangement of transmitter cells which will be described in further detail later. The size of the transmitter array 110 may be approximately 40 cm×40 cm. The sensor array 130 may be constructed using a 256×256 arrangement of detectors which receive return light 220 through steering elements and lenslets which will be described in further detail later. The size of the sensor array 130 may be approximately 80 cm×80 cm.

Figure 2B:
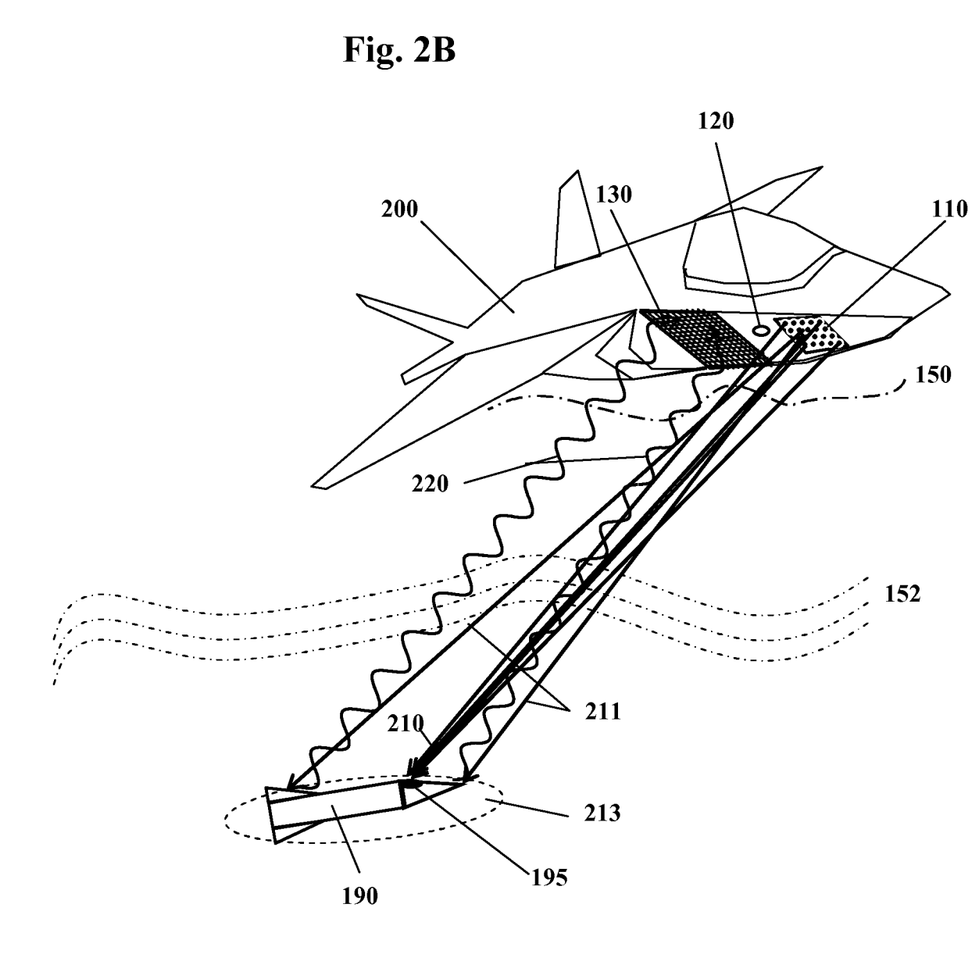
FIG. 2B schematically illustrates the multi-beam laser control and imaging system of FIG. 1 mounted on an airborne platform and used in a target engagement and imaging scenario.

FIG. 2B illustrates a combined engagement and imaging scenario that utilizes the multi-beam laser beam control and imaging system 100 mounted onto an aircraft 200. The transmitter array 110 emits multiple beamlets 210 steered and phased so that they are tightly focused at the hitspot 195 on the target 190. The phase of one of the transmitter array beamlets 211 is altered which creates a larger illumination area 213 covering a larger area than the hitspot 195. The return light 220 is received at the sensor array 130. The processor 140 (which is not shown in the figure) mounted inside the aircraft 200 receives multiple readings from the sensor array 130 which are used to calculate phase modulation values for certain beamlets of the transmitter array 110 and an image of the target 190 and an image of the hitspot 195 on the target. Note that the illuminator 120 is not utilized.

Figure 3:
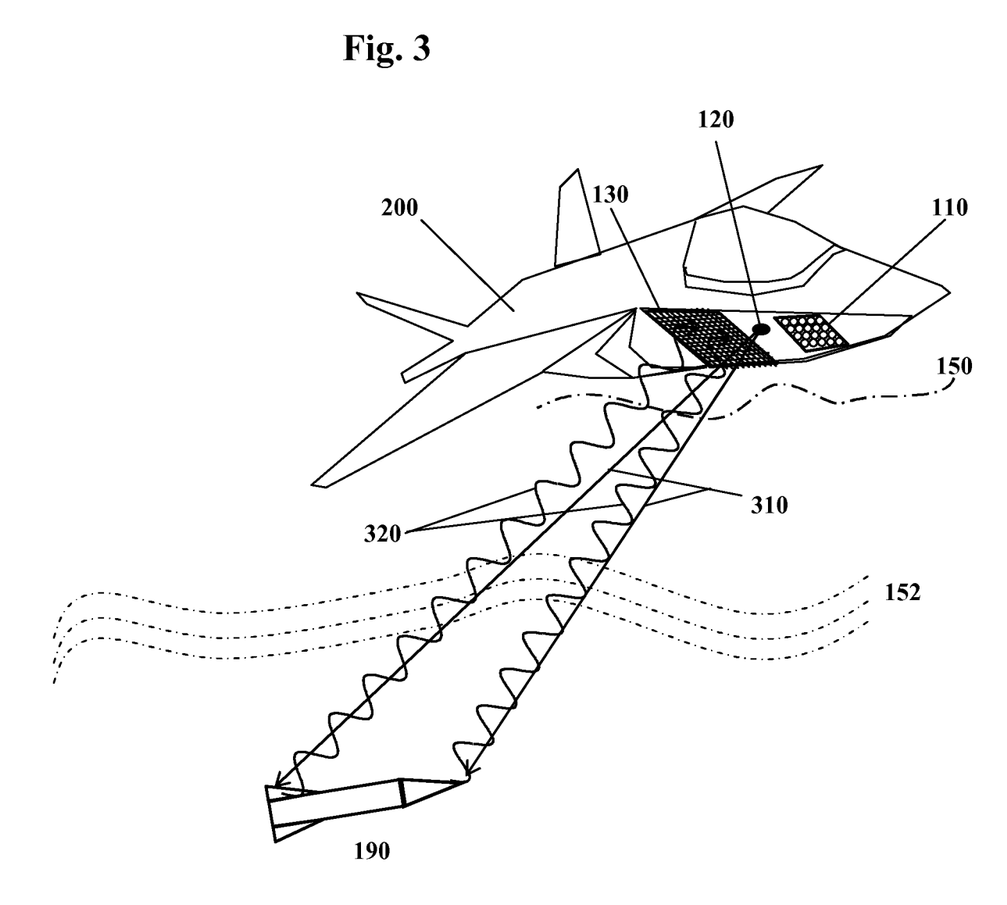
FIG. 3 schematically illustrates the multi-beam laser control and imaging system of FIG. 1 mounted on an airborne platform and used in a target imaging scenario.

FIG. 3 illustrates an imaging scenario that uses the multi-beam laser beam control and imaging system 100 mounted onto an aircraft 200. The illuminator 120 emits one or more beamlets 310 towards the target 190. The return light 320 is received at the sensor array 130. The processor 140 (which is not shown in the figure) mounted inside the aircraft 200 receives data from the sensor array 130. The data is used to calculate a two or three dimensional image of the target 190 using a procedure explained later.

Figure 4:
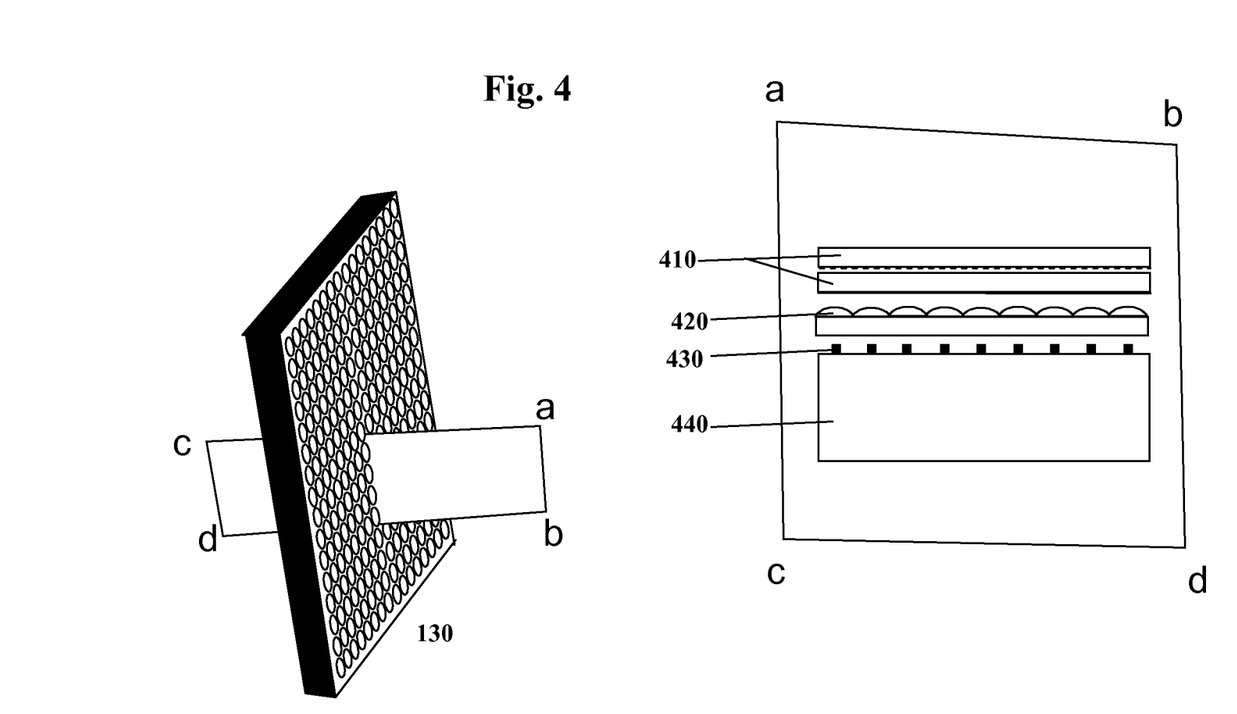
FIG. 4 schematically illustrates the sensor array of the multi-beam laser control and imaging system of FIG. 1 in further detail.

FIG. 4 illustrates the elements of the sensor array 130 in greater detail. The drawing on the right is shows the planar cross section with corners abcd through the sensor array 130 as shown on the left. The incoming light first goes through steerable gratings 410, which adjusts the angle of incidence so the incoming light can be focused onto detectors 430 by lenslets 420. The detectors 430 are coupled to data acquisition electronics 440 that communicate with the processor 140. The steerable gratings 410 may be omitted if the incoming light can be focused onto detectors 430 without steering.

Figure 5:
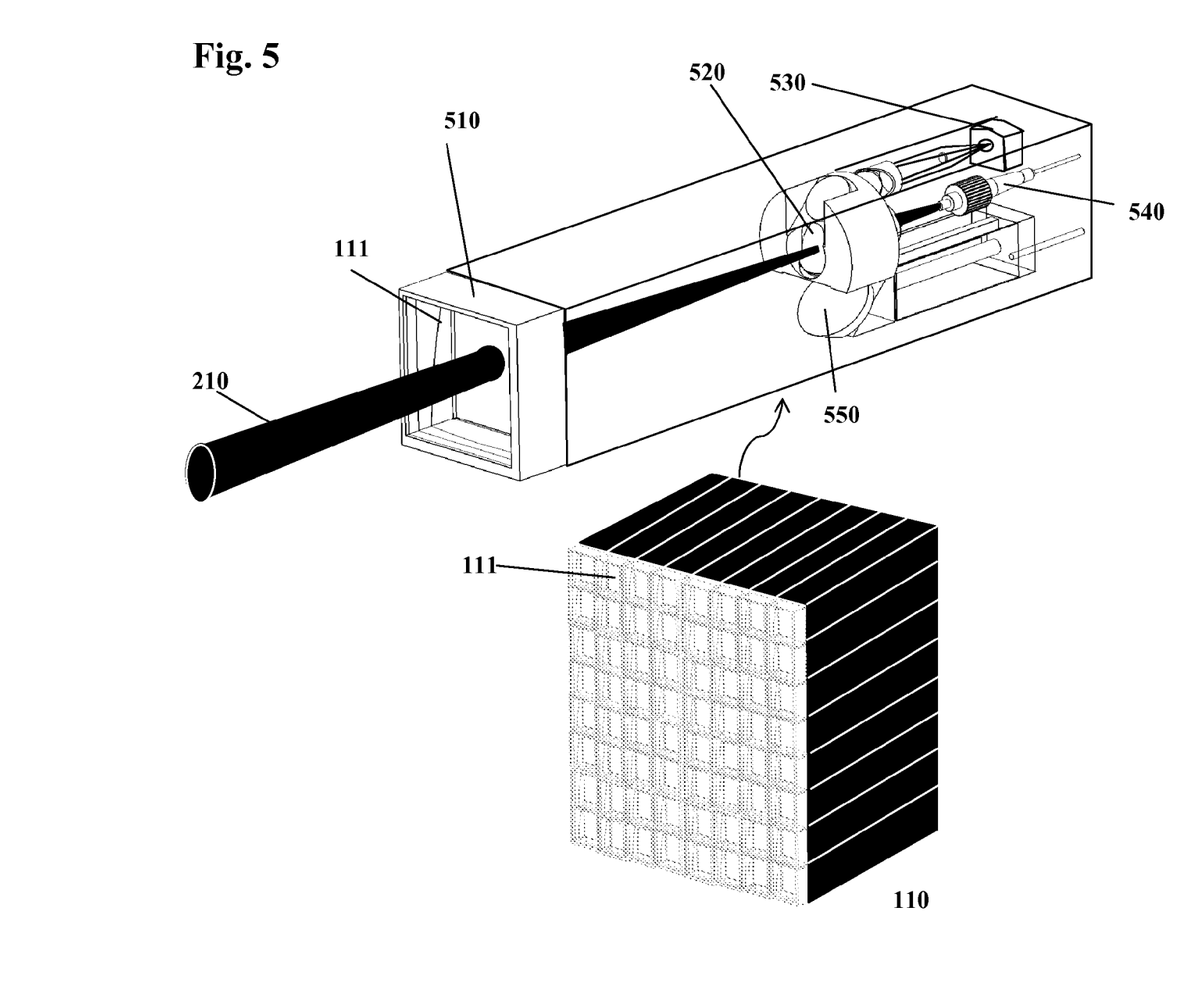
FIG. 5 schematically illustrates the transmitter array of the multi-beam laser control and imaging system of FIG. 1 in further detail.

FIG. 5 illustrates an embodiment of a single unit of the transmitter array 110 and the elements behind a single aperture 111 of the transmitter array 110. The aperture 111 is formed by a quarter waveplate and collimating lens combination 510. The source of the transmitter array beamlet 540 emits a laser beam 210 towards a polarizing aperture sharing element 520. Part of the beam is reflected from the aperture sharing element 520 towards a fast steering mirror 550 which then reflects it through the aperture sharing element 520 towards a tracking focal plane array or sensor 530. The data from the tracking focal plane allows laser beam 210 to be accurately pointed toward the target using a fast steering mirror 550. The output of the sensor 530 may be coupled to the fast steering mirror 550 either through a local processing loop or through the system processor 140.

Figure 6:
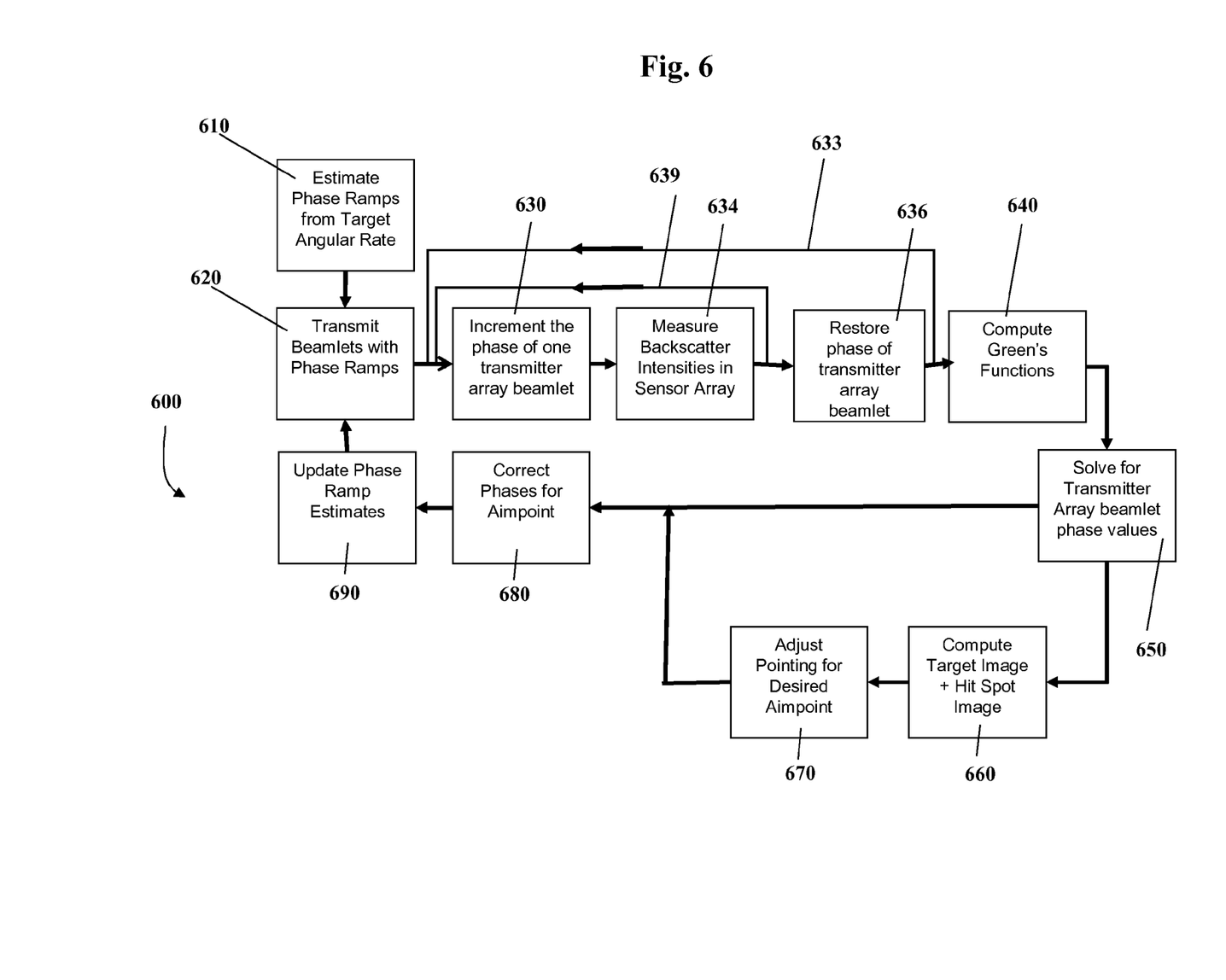
FIG. 6 is a flowchart illustrating a method of operating a multi-beam laser control and imaging system in a combined target engagement and imaging scenario as depicted in FIG. 2B.

FIG. 6 illustrates a procedure 600 for operating the multi-beam laser control and imaging system 100 described above.

The procedure 600 is appropriate for engaging and imaging moving targets. The procedure 600 can be carried out without exercising the illuminator 120. Therefore, procedure 600 is also appropriate for a multi-beam laser control and imaging system 100 that does not include an illuminator 120.

At the beginning of an engagement scenario, the beamlets of the transmitter array are co-boresighted to the moving target and randomly phased. Due to potentially high slew rates of many types of targets (e.g., 300 m/sec at 1 km range), the beamlet phases emitted from the transmitter array need to be linearly ramped in time many times per second. In fact, the rate of change required may be much faster than the rate of update of the phase control loop.

The first step 610 of the procedure 600 is estimating the phase ramps from target's angular slew rate. The target angular slew rate is the rate at which the target is moving with respect to the multi-beam laser control and imaging system 100. This is an initial estimate which may be communicated to the multi-beam control and imaging system from external sensors, such as radar or heat sensors that locate and track the target. Furthermore, an external tracker with an inertial sensor reference may be used to obtain an initial estimate of horizontal and vertical slew rates for the target, which in turn would allow the phase control loop to estimate initial phase slew rates for each beamlet. Hence, the phase control loop may act as a phase rate controller by updating the linear time coefficients rather than just the phase itself.

The second step 620 is transmitting the beamlets with the phase ramps. This means turning on the beamlets of the transmitter array with phase offsets that accommodate the angular slew rate of the target. Once the beamlets from the transmitter array are slewing in phase so that they can be locked onto the moving target, the phases of the beamlets emitted from the transmitter array may be further adjusted for focusing a laser beam on the target. This is accomplished in steps 630, 634, 636, 640, 650, 680, and 690. The steps 660 and 670 are directed towards imaging the target and the hitspot on the target. The steps 660 and 670 may further aid the process of focusing a laser beam on a specific point on the target.

Steps 630, 634 and 638 are carried out in two nested loops 633 and 639. The outer loop 633 is repeated as many times as the number of beamlets in the transmitter array. The inner loop 639 may be repeated twice (or more) per beamlet. In step 630, the phase of one beamlet is incremented by a known non-zero amount, e.g., $\pi/2$, which is added onto the phase ramp for that beamlet. Any nonzero beamlet phase increment changes the speckle intensity pattern scattered back from the target. The intensities registered at all detectors of the sensor array are measured in step 634. The second iteration of the loop 639 for the same beamlet involves incrementing the phase of the same beamlet once more by a known amount (step 630) and measuring the intensities at the sensor array (step 634). After the second iteration of the inner loop 639, the phase of the beamlet is restored to its original value in step 636. At this time another measurement may be made, i.e., the step 634 may be repeated after step 636 before going back to step 630. The steps 630 and 634 are then repeated twice (or more) for the next beamlet, leading to step 636 which restores the phase value of the next beamlet.

One way to reduce the number of data points collected (as well the number of computations that use these data points) is to combine multiple detector readings in the sensor array. The intensities registered at all detectors of a 256×256 detector sensor array add to 65,536 values. Aggregating values in neighboring detectors will reduce this. For example, aggregating 2×2 regions of detectors will result in only 16,384 values. Aggregating 8×8 regions of detectors will result in 1024 values. It is advised that the resolution of the sensor array reading is at least twice that of the transmitter array. Hence, 8×8 aggregation of detectors for a 256×256 detector sensor array is appropriate (resulting in 32×32 measurements) for an 8×8 transmitter array.

It is expected that the outer loop 633 will take about one microsecond, which implies that steps 630, 634, and 636 can be carried out in less than 100 microseconds for an 8×8 transmitter array.

Before moving onto describing the next step (640), it may be useful to discuss the nature of the data collected from the sensor array thus far. During the sensor array data acquisition step 634, the transmitter array beamlet with the incremented phase has a wider divergence than the composite light emitted from the transmitter array. Consequently, the corresponding transmit aperture illuminates a much wider area around the target than the transmitter array. This phenomenon is important in beam control and imaging.

Given that incrementing the phase of one beamlet changes the speckle intensity pattern scattered back from the target, a full phase measurement can be made every time one beamlet phase is changed. In case of the 8×8 transmitter array mentioned earlier, this occurs approximately every microsecond. During this measurement process, the speckle pattern coming back from the target is also moving at twice the cross-range velocity of the target plus an additional amount equal to twice the target turn rate times the range. Overall, it is expected that the speckle pattern would be moving less than 1000 m/sec. Over one microsecond, this would correspond to a 1 mm motion—which is considered negligible compared to the expected size of the sensor array apertures. However, over the 100 microsecond period to measure all the phase data, one would get as much as a 100 mm shift which is likely to span multiple receive apertures. In many cases this amount of shift will be acceptable, but may need be taken into account by the phase control process and computation.

When a beamlet is successively shifted in phase from its current value twice, each receive aperture of the sensor array receives three samples from a sine wave pattern, corresponding to the current (unincremented) value, the first incremented value and the second incremented value of the phase. These samples can in turn be used in step 640 to determine the complex Green's functions relative to the nominal speckle pattern for that beamlet. Each complex Green's function contains all the details of the optical path of a single beamlet emanating from a single transmitter array transmit aperture to one of the receive apertures of the sensor array. The phase can only be determined relative to the hitspot speckle pattern phase (which is initially unknown). This relative information is sufficient to determine the control phases to produce a desired hit spot on the target.

The computation using sensor array data yields a unique solution for the imaginary part of each Green's function (subject to noise), but there are always two solutions to the real part of the Green's function—one usually much dimmer than the other. The dimmer solution is the useful one most of the time. The physical reason for this is that the brighter solution imposes an assumption that most of the power incident upon the receive aperture is coming from one transmitter beamlet with the remaining beamlets summing to a smaller value. While this is not impossible, it is unlikely. Consequently, the dimmer solution is almost always correct and can be used in subsequent computations.

Once all Green's functions have been computed, the next step 650 is aimed at solving for the transmitter array beamlet phase values. This is accomplished using two of the key symmetry principles of speckle imaging itemized below:

1) When the illuminating beamlet moves one step to the right, the return speckle pattern moves one step to the left—and the same for vertical shifts.
2) The speckle pattern for a beamlet is multiplied by the complex phase of the beamlet.

Since the Green's functions are just the speckle patterns, one can estimate the rowwise and columnwise phase differences between adjacent beamlets by summing up the complex conjugate products of two Green's functions from adjacent receive apertures over all the receive apertures. This can be written as follows:

$$\Delta Phs_{col_{ja,ka}} = \sum_{x_{sns}} \sum_{y_{sns}} \left[ \left[ G_{0_{ja,ka}}(x_{sns}, y_{sns}) \right] G_{0_{ja,ka+1}}(x_{sns}, y_{sns}) \right]$$

$$\Delta Phs_{row_{ja,ka}} = \sum_{x_{sns}} \sum_{y_{sns}} \left[ \left[ G_{0_{ja,ka}}(x_{sns}, y_{sns}) \right] G_{0_{ja+1,ka}}(x_{sns}, y_{sns}) \right]$$

where G0 ja,ka (xsns,ysns) is the Green's function corresponding to transmit aperture row ja, column ka, and receive aperture row xsns and column ysns, $\Delta Phs_{col ja,ka}$ is the columnwise phase gradient at transmit aperture at row ja, column ka, and $\Delta Phr_{ow ja,ka}$ is the rowwise phase gradient at transmit aperture at row ja, column ka.

The phase gradients computed in this fashion are complex numbers whose phase represents the phase difference between the two beamlets, and whose magnitude represents the certainty of that estimate. These rowwise and columnwise gradient estimates can be combined into a global estimate of phase error using a noise-optimized 2D integrator called a Complex Exponential Reconstructor—an algorithm used widely in the art of both speckle imaging and branch point adaptive optics. Once the phase values for the transmitter array beamlets have been computed, they may be corrected in step 680 to aim the focused hitspot to a different location on the target. The corrected phase values are then used to update the phase ramps. This can be followed by step 620 wherein the updated phase ramps are applied to beamlets emitted from the transmitter array. The procedure 600 can be carried out in this fashion until the end of the target engagement. As mentioned earlier, steps 660 and 670 may aid the process of focusing a laser beam on a specific point on the target. These steps also carry out imaging functions of the multi beam control and imaging system 100. Imaging method is based on a technique similar to the one used for computing phase values for the transmitter array beamlets.

For imaging related calculations of step 660, the sensor array data is used to estimate the phase error in the receive apertures. The following symmetry principle from speckle imaging is utilized: The mean value of the row and column field gradient is the same for all beamlets and all positions in the speckle pattern. This is actually a restatement of the Van Cittert-Zernike theorem known in the art which says that in the far field, the expectation of the complex field product is proportional to the Fourier transform of the incoherent image. Hence, the symmetry principle can be used to compute an image of the target.

The Van Cittert-Zernike theorem can be restated as the following equation:

$$\text{Mean}(\overline{GF(\vec{x})} \cdot GF(\vec{x} + \overrightarrow{\Delta x})) = Const \cdot \int e^{i \cdot k \cdot \overrightarrow{\Delta x} \cdot \vec{\alpha}} \cdot Img_{tgt}(\vec{\alpha}) d\vec{\alpha}$$

where k=2π/wavelength, $Img_{tgt}$ is the image of the target and $GF(\vec{x})$ is the complex wavefront returning to the sensor due to a single beamlet illuminating the target. It is commonly referred to as a Green's Function in the optical literature.

The rowwise and columnwise phase gradients $\Delta Phs(\overrightarrow{x_{bmlet}})$ can be estimated by averaging the gradient over all beam speckle patterns. Then, the exact phase can be reconstructed using the Complex Exponential Reconstructor—an algorithm used widely in the art of both speckle imaging and branch point adaptive optics. The equation is provided below:

$$\Delta Phs_{col}(\overrightarrow{x_{bmlet}}) = \sum_{x_{sns}} \sum_{y_{sns}} \left[ \left[ G_{0_{js,ks}}(\overrightarrow{x_{bmlet}}) \right] G_{0_{js,ks}}(\overrightarrow{x_{bmlet}} + \overrightarrow{\Delta_{col}}) \right]$$

$$\Delta Phs_{row}(\overrightarrow{x_{bmlet}}) = \sum_{x_{sns}} \sum_{y_{sns}} \left[ \left[ G_{0_{js,ks}}(\overrightarrow{x_{bmlet}}) \right] G_{0_{js,ks}}(\overrightarrow{x_{bmlet}} + \overrightarrow{\Delta_{row}}) \right]$$

One can then apply wavefront error at the sensor array plane to the actual data and Fourier transform the field to obtain an image of the target. To obtain an image of the hitspot on the target one needs to apply the calculated transmitter array beamlet phases from step 650 to the laser transmitter array beamlets and compute where in the field the hitspot will be located. Adding the two images (of the target and the hitspot) yields an image of the hitspot on the target. This addition concludes step 660.

The step 670 may be omitted if the hitspot is already at the desired location on the target. Step 670 may be used to steer the hitspot when the hitspot is not at a desired location. For most conditions where the atmospheric turbulence is not extreme, the repositioning of the hitspot may be carried out simply by adding a tilt to the calculated phase values from step 650 which then moves the hitspot to the desired location. However, in the case of significant atmospheric turbulence, the phase solution can change significantly from one location to the other. In that case, alternate sets of phase solutions may be generated and the one closest to the desired location can be used.

Figure 7:
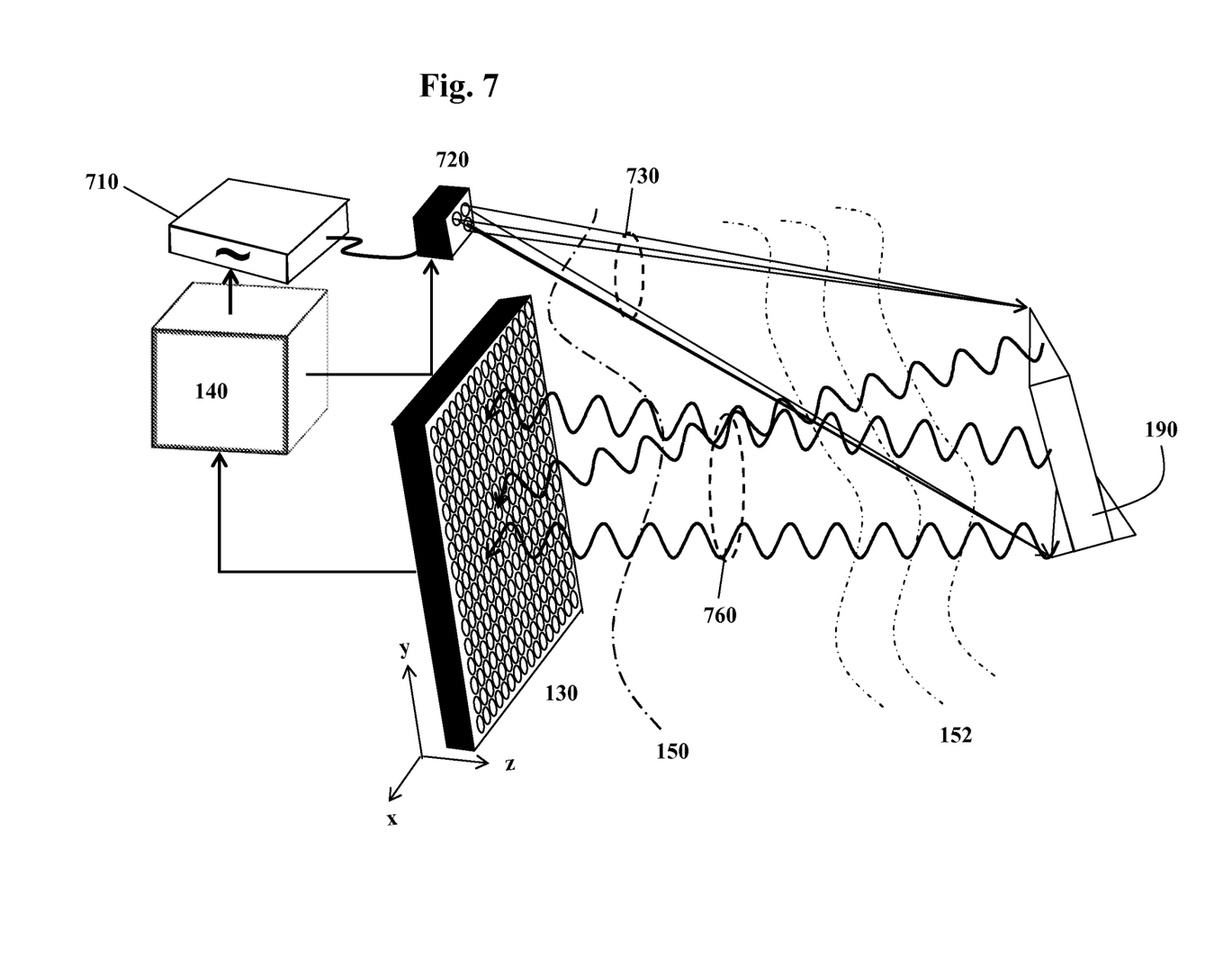
FIG. 7 schematically illustrates some elements of the multi-beam laser control and imaging system as they would be utilized in a target imaging scenario as depicted in FIG. 3.

FIG. 7 illustrates a three beamlet illuminator 720 and sensor array 130 configured for a three dimensional imaging of the target 190. The illuminator 720 is configured to emit three beamlets 730 towards the target 190 through three transmit apertures, and the sensor array 130 is configured to receive light 760 scattered by the target 190 illuminated by the beamlets 730. The illuminator 720 receives laser light from a laser source 710. The laser source 710 is configured to produce laser light at least at two wavelengths. The laser source may also be providing laser light to the transmitter array 110 (not shown). The processor 140 communicates with the sensor array 130 and is configured to form images of the target 190 based upon the output from the sensor array 130. The processor 140 may also be configured to control the illuminator 720 and the laser source 710. Two of the beamlets emitted from the illuminator 720 are laterally displaced (sheared) with respect to the third beamlet. Three beamlets emanate from three apertures at the laser illuminator. One of the beamlets are considered the reference beamlet, a second beamlet is sheared in the x direction with respect to the referenced beamlet and the third beamlet is sheared in the y direction with respect to the reference beamlet forming an "L" spatial pattern. The beamlets are also shifted slightly in frequency with respect to one another. The first reference beamlet has frequency (v0), the second x-sheared beamlet has frequency (v0+vx) and the third y-sheared beamlet has frequency (v0+ vy). The frequency differences cause the beamlets to "beat" at the object at the difference frequencies. The beat frequencies are vx, vy, and vx−vy. The frequency shifts are usually very small compared to the actual frequencies of the beamlets. The frequency shifts may be realized using phase modulators included in the illuminator 720. The processor 140 may be configured to control the phase modulators associated with at least one of the beamlets. The beamlets 730 travel through a boundary condition 150 and atmospheric turbulence 152 to reach the target 190. The object 190 scatters the incident beamlets 730. The scattered laser light 760 produces a modulated speckled intensity pattern at the sensor array 130. Speckles are formed since the object surface usually has roughness on the order of the laser wavelength. The detector array 130 measures the spatial and temporal behavior of the modulated speckled intensity pattern at the wavelengths emitted by the illuminator 720. These speckles are registered by the detectors of the sensor array 130. The registered values are used to form a two or three dimensional image of the target 190.

Figure 8:
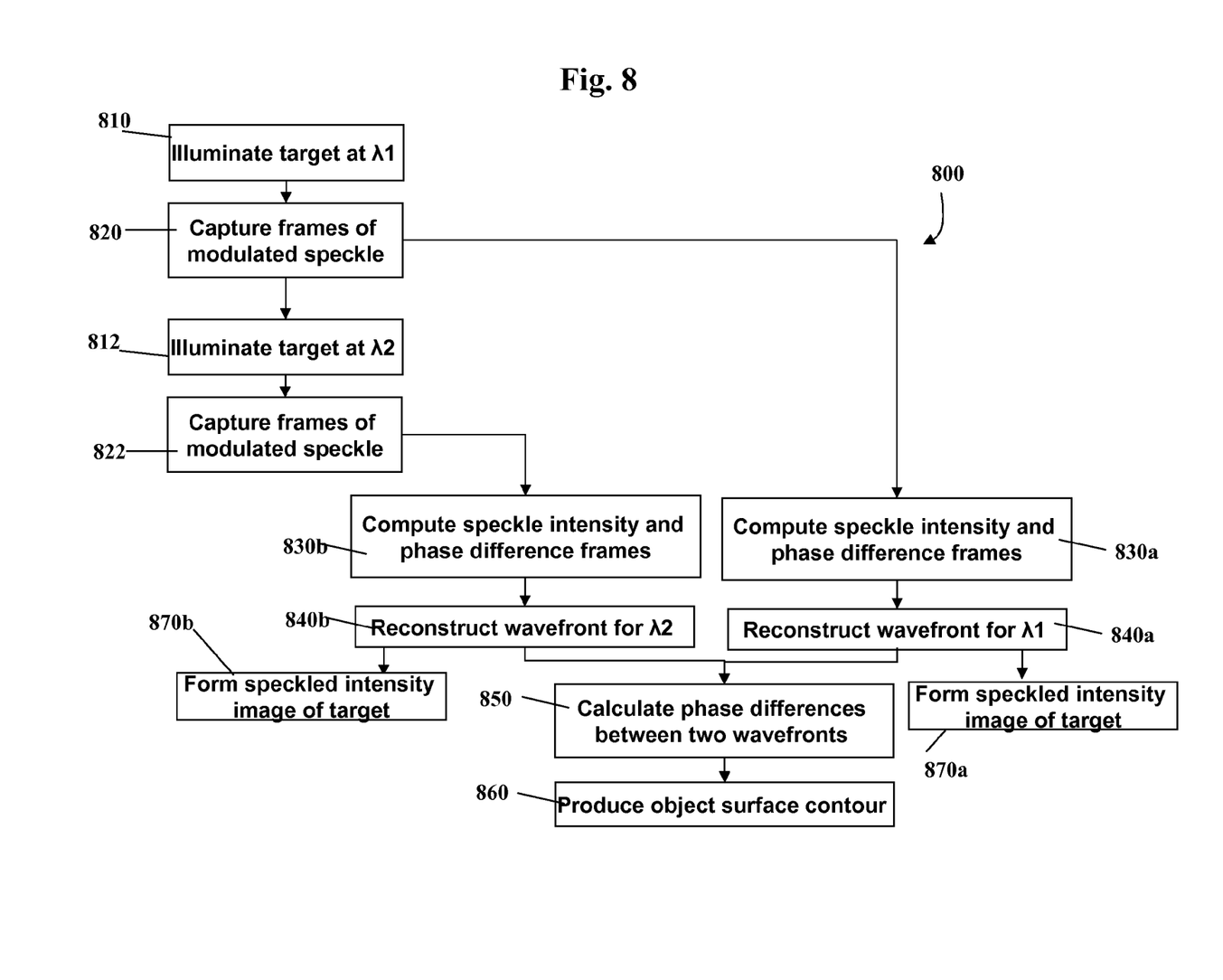
FIG. 8 is a flowchart illustrating a method of operating a multi-beam laser control and imaging system in a target imaging scenario as depicted in FIG. 3.

FIG. 8 illustrates a procedure 800 for operating the three beamlet illuminator 720 and sensor array 130 shown in FIG. 7. The process starts with step 810, namely illumination of the target 190 at the first wavelength ($\lambda 1$). The processor 140 sets a first wavelength at the laser source 710 and directs the laser illuminator 720 to send at least three pulsed or continuous beamlets 730 towards the target 190 at the first wavelength ($\lambda 1$). During this illumination step 810 the processor 140 adjusts the phase modulators coupled to at least one of the beamlets 730 in a way that produces slight shifts in the frequency of the outgoing beamlets 730. Next at step 620, the detector array 130 receives and captures frames of modulated speckled intensity patterns. Due to the three frequency-shifted beamlets, the measured speckled intensity pattern is a superposition of three patterns. This first set of sensor array measurements corresponding to the illumination at the first wavelength $\lambda 1$ are communicated to the processor 140. The process continues with step 812, namely illumination of the target 190 at the second wavelength $\lambda 2$. The processor 140 sets a first wavelength at the laser source 710 and directs the laser illuminator 720 to send at least three pulsed or continuous beamlets 730 towards the target 190 at the second wavelength $\lambda 2$. During this illumination step 812 the processor 140 adjusts the phase modulators coupled to at least one of the beamlets 730 in a way that produces slight shifts in the frequency of the outgoing beamlets 730. It should be noted that ideally all the illuminator beamlets at all wavelengths should be directed to illuminate substantially the same area on the target region with substantially the same intensity profile and phase distribution.

Next at step 822, the detector array 130 receives and captures frames of modulated speckled intensity patterns. Due to the three frequency-shifted beamlets, the measured speckled intensity pattern is a superposition of three patterns. This second set of sensor array measurements corresponding to the illumination at the second wavelength $\lambda 2$ are communicated to the processor 140.

Alternately, the process 800 can be modified so that steps 810 and 812 are executed in succession. In that case, step 812 will be followed by steps 820 and 822. This modification may be preferred if the target 190 is positioned a substantial distance away from the illuminator 720 and/or the sensor array 130. For example, consider a scenario where the sensor array 130 and the illuminator 720 are positioned in close proximity and the target 190 positioned 15 km away from the sensor array 130 and the illuminator 720. The time interval between the illuminator 720 sending of the beamlets 730 and the sensor array 130 registering the return light from the target will be about 100 micro seconds. The illuminator 720 can be configured to send out two 10 microsecond long pulses spaced 20 microseconds apart, the first pulse at the first wavelength and the second pulse at the second wavelength, wait 100 microseconds from the initiation of the first pulse, detect the return from the first pulse for 10 microseconds, wait another 20 microseconds and then detect the return from the second pulse for another 10 microseconds. As with the case where the order of steps is 810, 820, 812, followed by 822, two sets of detector array measurements are obtained and sent to the processor 140.

At this point, the processor 140 has two sets of sensor array measurements, where each set corresponds to data obtained at one illumination wavelength. As shown in FIG. 8, each set is processed separately. The first set corresponding to the first illumination wavelength goes through steps 830*a*, 840*a* and 870*a* whereas the second set corresponding to the second illumination wavelength goes through 830*b*, 840*b* and 870*b*.

At steps 830*a* and 830*b*, speckle intensity and phase difference frames are calculated. In the three beamlet case, the measurements can be demodulated at the beat frequencies vx, vy, and vx-vy to yield estimates of the intensity visibilities and phase differences. The optical field amplitude of one of the beamlets can then be obtained from the visibility estimates. The optical phase of the wavefront can be found using the phase difference estimates. Accordingly, at steps 830*a* and 830*b*, the processor 140 demodulates the two sets of sensor array measurements to yield estimates of intensity visibilities and phase differences.

Once visibility and phase difference values are computed, the next step is reconstructing the wavefronts, that is, recovering the optical field amplitude and phase. Accordingly, at steps 840*a* and 840*b*, two wavefronts are constructed, one corresponding to the first illumination wavelength and the other corresponding to the second illumination wavelength.

At this point, one can generate either a two dimensional image or a three dimensional image with target surface contours.

To generate a two dimensional image, steps 870*a* or 870*b* is carried out. This means that the reconstructed wavefront is inverse Fourier transformed and the squared modulus is computed to yield a two dimensional snapshot image. This two dimensional snapshot image is often heavily speckled. A series of snapshot images can be collected, registered, and averaged to reduce speckle noise in the final two dimensional image.

To generate a three dimensional image, step 850 is carried out. The phase differences between the two wavefronts corresponding to the two wavelengths are calculated. The phase difference at sensor array position r is proportional to the relative object surface contour depth at the corresponding detector position. The final step 860 produces a target surface contour image using the phase differences. One option for constructing this contour image involves continuizing the phase differences.

Selection of the numerical values of the illumination wavelengths requires some consideration. The object surface contour depth change along the of a vector perpendicular to the sensor array plane corresponding to a $2\pi$ change in speckle phase is equal to $\lambda 1 \lambda 2/(2\Delta\lambda)$ where $\lambda 1$ is the first illumination wavelength, $\lambda 2$ is the second illumination wavelength and $\Delta\lambda$ is the difference between the two illumination wavelengths. As an example consider two illumination wavelengths, $\lambda 1=1.5000000562$ microns and $\lambda 2=1.5000000000$ microns. Using these two illumination wavelengths will result in a surface contour depth range of 20 m. Depth variations greater than 20 m will be ambiguous. On the other hand, within the 20 m depth range, one can expect a resolution of 10 cm or better.

By illuminating with a third wavelength at a larger $\Delta\lambda$, the accuracy of range resolution can be increased by an order of magnitude similar to the process used in multi-wavelength interferometry. As an example consider three illumination wavelengths, $\lambda 1=1.5000000562$ microns, $\lambda 2=1.5000000000$ microns, and $\lambda 3=1.5000006170$ microns. Illumination at the first two wavelengths ($\lambda 1$, $\lambda 2$) leads to a depth contour phase change of $2\pi$ every 20 m as explained earlier. Adding illumination at $\lambda 3$ leads to a depth contour phase change of $2\pi$ every 2 m which can further refine the accuracy of the depth contour obtained using just ($\lambda 1$, $\lambda 2$) illumination wavelengths. This approach can be applied further using a fourth, fifth, and sixth illumination wavelengths to further refine the depth contour image of the object.

Since most targets scatter independent speckle patterns into each polarization, this range sensing process can be applied to both polarizations simultaneously to get two independent range images. Since the speckle intensities will be independent, the number of places where both speckle patterns become dark will be greatly reduced, providing a better quality range image.

Thus, a control and imaging system for a multi-beam laser is disclosed. The system can be used to focus a high quality beam upon a remote target. The system incorporates a method for measuring the phase distortions encountered by each of the beamlets of the laser en route to the target and back to a sensor array and a method for determining the phase of each of the beamlets so that a tightly focused composite beam is incident on a desired location on the target. The system also incorporates a method of imaging the target using one of the beamlets and a method of imaging the target using a three beamlet illuminator.

While embodiments of the invention has been shown and described, it will be apparent to those skilled in the art that many more modifications are possible without departing from the inventive concepts herein. The invention, therefore, is not to be restricted except in the spirit of the following claims.

What is claimed is:

1. A multi-beam laser control and imaging system comprising:
a laser transmitter configured to emit laser light in a plurality of beamlets, each beamlet being emitted through a separate transmit aperture of the laser transmitter towards a target, wherein at least two of the beamlets are hitspot beamlets forming a high intensity hitspot on the target, and one or more of the remaining beamlets are illuminating beamlets, each illuminating beamlet being coherent with all other beamlets and illuminating a region around the hitspot on the target;
a sensor configured to receive a laser light return, the laser light return resulting from at least one of the beamlets incident on the target;
a processor configured to compute a relative phase of a wavefront of the laser light return based on output from the sensor; and
a controller communicably coupled to the processor and to the laser transmitter and configured to adjust a phase of at least one of the beam lets in response to the relative phase computed by the processor.

2. The system of claim 1, wherein the sensor is further configured to detect the phase distortions induced in at least one of the beamlets by a transmission medium optically disposed between the laser transmitter and the sensor.

3. The system of claim 1, wherein the sensor comprises a plurality of sub-sensor and receiving aperture pairs.

4. The system of claim 1, wherein at least three of the remaining beamlets are illuminating beamlets.

5. The system of claim 4, wherein the sensor is further configured to detect an intensity of speckle patterns caused by scattering of laser light of the target, and the processor is further configured to compute one of an image of the target or a superimposed image of the target with the hitspot on the target.

6. The system of claim 4, wherein the illuminating beamlets are emitted in simultaneous pulses of a first wavelength followed by simultaneous pulses of a second wavelength.

7. The system of claim 6, wherein the processor is further configured to compute a range image of the target.

8. A multi-beam laser control and imaging system comprising:
a laser transmitter configured to emit laser light in a plurality of beamlets, each beamlet being emitted through a separate transmit aperture of the laser transmitter towards a target, wherein at least two of the beamlets are hitspot beamlets forming a high intensity hitspot on the target, and one or more of the remaining beamlets are illuminating beamlets, each illuminating beamlet being coherent with all other beamlets and illuminating a region around the hitspot on the target;
a sensor configured to receive a laser light return, the laser light return resulting from at least one of the beamlets incident on the target; and
a processor communicably coupled to the sensor and configured to compute one of an image of the target or a superimposed image of the target with the hitspot on the target.

9. The system of claim 8, wherein the sensor is further configured to detect phase distortions induced in at least one of the beamlets by a transmission medium optically disposed between the laser transmitter and the target.

10. The system of claim 8, wherein the sensor comprises a plurality of sub-sensor and receiving aperture pairs.

11. The system of claim 8, wherein at least three of the remaining beamlets are illuminating beamlets.

12. The system of claim 11, wherein the sensor is further configured to detect an intensity of speckle patterns caused by scattering of laser light off the target.

13. The system of claim 11, wherein the illuminating beamlets are emitted in simultaneous pulses of a first wavelength followed by simultaneous pulses of a second wavelength.

14. The system of claim 13, wherein the processor is further configured to compute a range image of the target.

15. A multi-beam laser control and imaging system comprising:
a laser transmitter configured to emit laser light in a plurality of beamlets, each beamlet being emitted through a separate transmit aperture towards a target, wherein a phase and direction of at least two of the beamlets are configured to form a high intensity hitspot on the target;
a laser illuminator configured to emit at least one illuminating laser beam, coherent with the laser transmitter beamlets, the illuminating laser beam configured to illuminate at least a region of the target surrounding the hitspot on the target;
a sensor configured to receive a laser light return, the laser light return resulting front at least one of the beamlets incident on the target;

a processor configured to compute a relative phase of a wavefront from the laser light return based on output from the sensor; and a controller communicably coupled to the processor and to the laser transmitter and configured to adjust a phase of at least one of the beamlets in response to the relative phase computed by the processor.

16. The system of claim 15, wherein the sensor is further configured to detect phase distortions induced in at least one of the beamlets by a transmission medium optically disposed between the laser transmitter and the target.

17. The system of claim 15, wherein the sensor comprises a plurality of sub-sensor and receiving aperture pairs.

18. The system of claim 15, wherein the laser illuminator is configured to emit at least three illuminating beamlets, the illuminating beamlets being configured to illuminate substantially the same area on the target and being coherent with one another and with the plurality of laser transmitter beamlets.

19. The system of claim 18, wherein the sensor is further configured to detect an intensity of speckle patterns caused by scattering of laser light off the target, and the processor is further configured to compute one of an image of the target or a superimposed image of the target with the hitspot on the target.

20. The system of claim 18, wherein the illuminating beamlets are emitted in simultaneous pulses of a first wavelength followed by simultaneous pulses of a second wavelength.

21. The system of claim 20, wherein the processor is further configured to compute a range image of the target.

22. A laser control and imaging system comprising:
a laser transmitter configured to emit a hitspot laser beam to form a high intensity hitspot on a remote target;
a laser illuminator configured to emit illuminating laser beam coherent with the hitspot laser beam, the at least one illuminating laser beam being configured to illuminate at least region of the target surrounding the hitspot on the target;
a sensor configured to receive a laser light return, the laser light return resulting from at least one of the hitspot laser beam and the illuminating laser beam incident on the target; and
a processor communicably coupled to the sensor and configured to compute one of an image of the target or a superimposed image of the target with the hitspot on the target,
wherein the illuminating laser beam comprises at least three illuminating beamlets configured to illuminate substantially the same area on the target, the illuminating beamlets being coherent with one another.

23. The system of claim 22, wherein the hitspot laser beam comprises a plurality of beamlets that are coherent with one another.

24. The system of claim 23, wherein the sensor is further configured to detect phase distortions induced in at least one of the beamlets by a transmission medium optically disposed between the laser transmitter and the target.

25. The system of claim 22, wherein the hitspot laser beam is emitted through a single continuous aperture.

26. The system of claim 22, wherein the sensor comprises a plurality of sub-sensor and receiving aperture pairs.

27. The system of claim 22, wherein the sensor is further configured to detect an intensity of speckle patterns caused by scattering of laser light off the target.

28. The system of claim 22, wherein the illuminating beamlets are emitted in simultaneous pulses of a first wavelength followed by simultaneous pulses of a second wavelength.

29. The system of claim 28, wherein the processor is further configured to compute a range image of the target.

30. A laser control and imaging system comprising:
a laser transmitter configured to emit a hitspot laser beam forming a high intensity hitspot on a remote target;
a laser illuminator configured to emit an illuminating laser beam coherent with the hitspot laser beam, the at least one illuminating laser beam being configured to illuminate at least a region of the target surrounding the hitspot on the target;
a sensor configured to receive a laser light return, the laser light return resulting from at least one of the hitspot laser beam and the illuminating laser beam incident on the target;
a processor configured to compute a relative phase of a wavefront from the laser light return based on output from the sensor; and
a controller communicably coupled to the processor and to the laser transmitter and configured to steer at least one of the laser illuminator beam or the laser transmitter beam,
wherein the illuminating laser beam comprises at least three illuminating beamlets configured to illuminate substantially the same area on the target, the illuminating beamlets being coherent with one another.

31. The system of claim 30, wherein the illuminating beamlets are emitted in simultaneous pulses of a first wavelength followed by simultaneous pulses of a second wavelength.

32. The system of claim 31, wherein the processor is further configured to compute a range image of the target.

33. A laser control and imaging: system comprising:
a laser transmitter configured to emit a hitspot laser beam forming a high intensity hitspot on a remote target;
a laser illuminator configured to emit an illuminating laser beam coherent with the hitspot laser beam, the at least one illuminating laser beam being configured to illuminate at least a region of the target surrounding the hitspot on the target;
a sensor configured to receive a laser light return, the laser light return resulting from at least one of the hitspot laser beam and the illuminating laser beam incident on the target;
a processor configured to compute a relative phase of a wavefront from the laser light return based on output from the sensor; and
a controller communicably coupled to the processor and to the laser transmitter and configured to adjust the wavefront of the hitspot laser beam in response to the relative phase computed by the processor.

34. The system of claim 33, wherein the illuminating laser beam comprises at least three illuminating beamlets configured to illuminate substantially the same area on the target, the illuminating beamlets being coherent with one another.

35. The system of claim 34, wherein the illuminating beamlets are emitted in simultaneous pulses of a first wavelength followed by simultaneous pulses of a second wavelength.

36. The system of claim 35, wherein the processor is further configured to compute a range image of the target.

* * * * *